United States Patent
Mori et al.

(10) Patent No.: US 6,611,098 B2
(45) Date of Patent: Aug. 26, 2003

(54) HERMETIC ENCAPSULATION PACKAGE AND METHOD OF FABRICATION THEREOF

(75) Inventors: Kenji Mori, Tokyo (JP); Yoshikazu Sakaguchi, Tokyo (JP)

(73) Assignee: NEC Corporation (JP)

( * ) Notice: Subject to any disclaimer, the term of this patent is extended or adjusted under 35 U.S.C. 154(b) by 88 days.

(21) Appl. No.: 09/776,093

(22) Filed: Feb. 2, 2001

(65) Prior Publication Data

US 2001/0013756 A1 Aug. 16, 2001

(30) Foreign Application Priority Data

Feb. 4, 2000 (JP) ........................................ 2000-028185

(51) Int. Cl.[7] .............................. H01J 63/04; H01J 9/26; H01J 9/32
(52) U.S. Cl. ........................... 313/512; 428/917; 445/25
(58) Field of Search ................................. 313/511, 512; 428/917; 445/23, 25, 38

(56) References Cited

U.S. PATENT DOCUMENTS 6,210,815 B1 * 4/2001 Ooishi ..................... 428/917 X

FOREIGN PATENT DOCUMENTS

| JP | 2-100289 | 4/1990 | ........... H05B/33/04 |
|---|---|---|---|
| JP | 3-37991 | 2/1991 | ........... H05B/33/04 |
| JP | 3-261091 | 11/1991 | ........... H05B/33/02 |
| JP | 4-363890 | 12/1992 | ........... H05B/33/02 |
| JP | 5-182759 | 7/1993 | ........... H05B/33/04 |
| JP | 7-169567 | 7/1995 | ........... H05B/33/04 |
| JP | 8-124677 | 5/1996 | ........... H05B/33/04 |
| JP | 8-236271 | 9/1996 | ........... H05B/33/04 |
| JP | 9-148066 | 6/1997 | ........... H05B/33/04 |
| JP | 9-274990 | 10/1997 | ........... H05B/33/12 |
| JP | 2813495 | 8/1998 | ........... H05B/33/04 |
| JP | 2813499 | 8/1998 | ........... H05B/33/04 |
| JP | 11-185956 | 7/1999 | ........... H05B/33/10 |
| JP | 11-329716 | * 11/1999 | |
| JP | 11-329718 | * 11/1999 | |
| JP | 11-339954 | * 12/1999 | |
| JP | 11-354272 | * 12/1999 | |
| JP | 2000-36384 | * 2/2000 | |

OTHER PUBLICATIONS

Tang et al, "Organic electroluminescent diodes", Applied Physics Letter vol. 51 No. 12, Sep. 1997 pps 913–915.
Nakata et al, "Display and Imaging" vol. 5, pps 273–277, (1997).
Nakata H., "Fundamental and Practical Techniques of Organic EL Element", Janpan Society of Applied Physics, Organic Molecular Bioelectronics Division, Sixth Lecture Notes, pps 147–154, 1997.
Flat Panel Display, 1998, p234, Nikkei Business Publications, Inc.
Horie, K., Critical Problems Remaining in Organic LED Device and Practical strategies, Japanese Research Association for Organic Electronics Materials, Published by Bunshin, pp 98–103.

* cited by examiner

Primary Examiner—Fred L Braun
(74) Attorney, Agent, or Firm—Hayes Soloway P.C.

(57) ABSTRACT

A hermetic encapsulation package and a method of fabricating such package, wherein at least one organic electroluminescent (EL) element is formed on a support substrate. A sealing cap for accommodating the organic EL element is bonded to the support substrate with an ultraviolet curing resin to form a sealed space defined by the sealing cap and the support substrate. At least part of the sealing cap is formed of an elastic material of a Young's modulus of 70 GPa or less. The elastic portion of the sealing cap is reversibly deflected to provide a decrease or increase in the volume of the sealed space to reduce pressure changes inside the sealed space caused by changes in temperature, thereby alleviating problems of thermal shock.

22 Claims, 6 Drawing Sheets

HERMETIC ENCAPSULATION PACKAGE AND METHOD OF FABRICATION THEREOF

BACKGROUND OF THE INVENTION

1. Field of the Invention

The present invention relates to a hermetic encapsulation package and a method of fabrication thereof. More particularly, it relates to a hermetic encapsulation package and a method of fabrication thereof, which are especially suitable for hermetically sealing organic EL (electroluminescent) elements used for plain light sources or display devices in which an electric field is applied to a light emitting layer of organic compounds to emit light therefrom.

2. Description of the Related Art

Electroluminescent elements (hereinafter referred to as EL elements) include inorganic EL elements and organic EL elements. Both EL elements are self luminescent and thus provide high visibility. In addition, since they are perfect solid-state elements, they provide improved resistance to a shock and can be handled easily. For these reasons, the EL element is being developed as pixels for use in graphic displays or television image display devices, or plain light sources. In particular, unlike the inorganic EL element, the organic EL element is not constrained to the requirements of alternating-current drive and high voltages. In addition, the variety of organic compounds employed by the organic EL element conceivably makes it relatively easy to provide multiple colors. Thus, application of the organic EL element for full-color displays or the like is expected and a structure of the organic EL element is being developed to provide high luminance at low voltages. The inorganic EL element is excited with an electric field to emit light. On the other hand, the organic EL element emits light by so-called carrier injection, in which positive holes are injected from the anode and electrons from the cathode for the operation of the organic EL element. The positive and negative carriers injected from both electrodes move to the opposite electrodes and are re-combined to form excitons therein. Relaxation of the excitons produces the emission of light which is in turn the light emission from the organic EL element.

The organic EL element was previously studied intensively using anthracene single crystal of high purity, however, such an organic EL element provided low luminance and low luminous efficiency with less stability irrespective of the necessity for the application of high voltages. However, in 1987, Tang et al from Eastman Kodak Company announced that they employed a two-layer stacked structure of organic thin film to provide a stable high-luminosity light emission at low voltages. Since then, the research and development of the organic EL element has been suddenly energized. In this structure, an organic layer sandwiched by a pair of electrodes was fabricated of two stacked layers of a light-emitting layer and a hole transport layer. The organic layer provides an outstanding property of 1,000 $cd/m^2$ upon application of 10V (Tang et. al., Appl. Phys. Lett., 51 (12), 913 (1987)). These days, in some cases, provided are not only the light-emitting layer and the hole transport layer but also an electron transport layer between the cathode and the light-emitting layer. Alternatively, a hole injection layer may be interposed between the hole transport layer and the anode. In addition, various studies on the materials used for each layer have yielded many results concerning an increase in luminous efficiency and longevity, leading to an increasing expectation of applying the organic EL element for flat panel display devices with the organic EL elements being arranged in a matrix of X-Y plane. Thus, this has led to the development of a monochromatic passive matrix panel with 256×64 dots, a ¼ VGA 5-inch diagonal color panel, and a VGA 10-inch diagonal color panel. (For example, reference can be made to Display and Imaging, Vol. 5, pp273–277 (1997) by Hitoshi Nakata et al; Fundamental and Practical Techniques of Organic EL Element by Hitoshi Nakata, the Japan Society of Applied Physics, Organic Molecular Bioelectronics Division, Sixth Lecture Notes, pp147–154 (1997); Flat Panel Display 1998, p234, Nikkei Business Publications, Inc., etc.)

The organic EL element has a structure in which an organic thin film of thickness equals to or less than 1 $\mu m$ sandwiched by two electrodes. Exposure of the element after fabricated to the surrounding atmosphere would cause the organic layer and the material of the electrodes to react somehow with gas (such as moisture and oxygen) in the atmosphere. This may cause non-light-emitting regions to appear on the element, referred to as dark spots, which degrade the light emission properties. Therefore, it is practically necessary to provide the element with an encapsulating mechanism to seal out the atmosphere immediately after the fabrication of the element. The sealing methods include a direct technique of providing a protective layer on the outer surface of the element or molding the element with resin or the like. An alternative method is an indirect technique of providing the element with a hollow structure using a cap or the like to seal out the atmosphere. In some cases, the element is directly protected and further provided with another sealing means.

Specific examples of the direct technique have been reported. In a method (Japanese Patent Laid-Open Publication No. Hei 3-37991), the element is molded with oxygen absorbent resin. In a method (Japanese Patent Laid-Open Publication No. Hei 7-169567), a gas barrier layer and a gas absorbent layer are employed at the same time. In a method (Japanese Patent Laid-Open Publication No. Hei 8-236271), the sealed space is filled with an elastic resin. In a method (Japanese Patent Laid-Open Publication No. Hei 8-124677), a stress relaxation layer is interposed between the rear surface and an adhesion layer of the organic EL element upon face-to-face bonding of a sealing material such as a glass plate to the rear surface of the organic EL element with the adhesive. In a method (Japanese Patent Publication No.2813495), an insulating polymer layer is provided on the outer surface of the element and further an insulating glass or the like is provided thereupon. In a method (Japanese Patent Publication No.2813499), an insulating inorganic compound material is provided on the outer surface of the element, a hygroscopic layer is deposited thereupon, and further an insulating glass layer or an insulating polymer film is provided thereupon. In a method (Japanese Patent Laid-Open Publication No. Hei 4-363890), the element is held in a fluorine-based inert liquid. In a method (Japanese Patent Laid-Open Publication No. Hei 5-182759), a non-permeable substrate is fixed to the element via a photo curing resin having moisture resistance. Finally, in a method (Japanese Patent Laid-Open Publication No. Hei 9-274990), a protective layer is provided on the outer surface of the element, the element is then molded with a sealing layer having a certain physical property, and a cap is further provided to seal out the atmosphere.

On the other hand, specific examples for the indirect technique previously reported include a method (Japanese Patent Laid-Open Publication No. Hei 9-148066) for fixing a desiccant within a hermetically sealed space in a spaced apart relationship from the element. Further included in the examples is a method (Japanese Patent Laid-Open Publication No. Hei 3-261091) for holding the element in a hermetically sealed space filled with a desiccant of phosphorus pentoxide ($P_2O_5$).

In the direct technique, either the protective layer is directly provided on the element or the element itself is molded directly with resin or the like. This causes great concerns to rise that the organic EL element formed of an organic film having a thickness of less than 1 μm may be susceptible to damage. The damage may be caused not only by force or heat applied directly to the element during the process but also by stress or the like generated on the interface between the element and a protective agent. It is therefore preferable to employ a method in which the element is not directly touched. Furthermore, the direct technique presents a problem of requiring an additional step in the process and causing an increase in cost.

On the other hand, the indirect technique provides the element with a hollow structure using a cap or the like to seal out the atmosphere, thus having no adverse effect on the organic EL element and providing a relatively simple process. To seal the element with a cap or the like, a sealing cap is bonded to the support substrate of the organic EL element with an adhesive or the like. In this method, it is necessary to tackle the problem of how to enhance the adhesion level of the cap to the substrate, provided that the cap itself acts as an effective barrier to gases. The development of adhesive holds the key to solving the problem. Accordingly, research and development have been conducted aiming to provide the adhesive with higher adhesion, higher gas barrier property, and a lower amount of out-gas or the like. (For example, reference may be made to Critical Problems Remaining in Organic LED Device and Practical strategies, by Kenichi Horie, the Japanese Research Association for Organic Electronics Materials, published by Bunshin, pp98–103.) Incidentally, since the organic EL element is vulnerable to heat, it should be noted so as not to allow the temperature of the element to rise when a thermosetting adhesive is used for the element.

Such an adhesive has been currently in an advanced stage of development to provide a higher sealing effect, however, not sufficient sealing effect. However, it is possible to provide a relatively good durability for the element by providing the element with a sufficiently wide adhesion width for a cap to be fixed thereto. Nevertheless, providing an excessively wide adhesion width to the device would cause the light emission region to be narrowed for the total area of the device. This would become a significant drawback, for example, in the application for notebook-type personal computers. It is therefore an important theme to enhance the sealing effect without a considerable increase in adhesion width.

Furthermore, in the method (Japanese Patent Laid-Open Publication No. Hei 9-148066) for accommodating the desiccant within the hollow hermetically sealed space of the element, it is necessary to fix the desiccant in the space to prevent the desiccant from touching the element. This leads to an increase in the number of steps in the process and in cost.

SUMMARY OF THE INVENTION

An object of the present invention is to provide a hermetic encapsulation package and method of fabrication thereof at low cost, in which the sealing effect of the hermetic encapsulation package is enhanced by sealing the organic EL element with a cap to thereby prevent dark spots and particularly durability is improved to thermal shock.

A hermetic encapsulation package according to the present invention comprises a support substrate, at least one element mounted on said support substrate, and a sealing cap bonded to said support substrate accommodating said element to form a sealed space defined by said support substrate and said sealing cap. Said sealing cap deforms to vary a volume of said sealed space according to an increase or a decrease in pressure inside said sealed space.

According to the present invention, the volume of the sealed space can be varied to allow a change in pressure inside the sealed space caused by a change in temperature to be relaxed, thereby reducing the amount of gases passing through between the surrounding atmosphere and the sealed space. Thus, the hermetic encapsulation package according to the present invention can be provided at low cost in a reduced number of steps of the fabrication process thereof and sufficiently prevent the degradation of the element accommodated therein.

An organic EL device, which contains an organic EL element and to which the hermetic encapsulation package can be preferably applied, comprises a pair of electrodes and at least one organic EL element which is mounted on the support substrate and has an organic compound layer, including at least a light-emitting layer composed of an organic compound, sandwiched between the pair of electrodes. The organic EL device is characterized in that said support substrate and the sealing cap are bonded to each other, and said sealing cap deforms according to an increase or a decrease in pressure inside the sealed space defined by said support substrate and the sealing cap, thereby varying the volume of the sealed space.

A portion of the sealing cap, opposite to the support substrate, preferably deflects to vary a volume of the sealed space.

In addition, the sealing cap can increase and decrease the volume of the sealed space so as to relax a change in pressure caused by a change in temperature of a gas inside the sealed space in a manner such that the sealing cap is deflected outwardly relative to the sealed space with increasing temperatures to increase a volume of the sealed space and is deflected inwardly relative to the sealed space with decreasing temperatures to decrease the volume of the sealed space. The sealed space preferably provides a decrease in volume of 5% or more at −35° C. and an increase in volume of 5% or more at 85° C., relative to a volume at 25° C.

Furthermore, at least part of the sealing cap is preferably formed of an elastic material of a Young's modulus of 70 GPa or less.

Still furthermore, a gas barrier layer is preferably provided at least on one of the outer and inner sides of the sealing cap. The Young's modulus of the gas barrier layer is preferably 70 GPa or less, which is the same as that of the sealing cap.

In addition, the support substrate and the sealing cap are preferably bonded to each other with an ultraviolet curing resin. The ultraviolet curing resin is preferably an epoxy-based resin.

A method for fabricating such an organic EL device comprises the steps of fabricating an organic EL panel having an organic EL element; and sealing for accommodating pixel-formed portion of the organic EL panel. The step of fabricating the organic EL panel comprises the step of depositing on a support substrate by sputtering or vapor deposition a predetermined pattern of an anode layer, an organic compound layer including at least a light-emitting layer composed of an organic compound, and a cathode layer in that order, or a predetermined pattern of a cathode layer, an organic compound layer including at least a light-emitting layer composed of an organic compound, and an anode layer in that order. On the other hand, the step of sealing includes the step of bonding a sealing cap, formed of an elastic material having a Young's modulus of 70 GPa or less, to the support substrate in a dried atmosphere so as to accommodate a pixel-formed portion of an organic panel.

DETAILED DESCRIPTION OF THE PREFERRED EMBODIMENT

Figure 1:
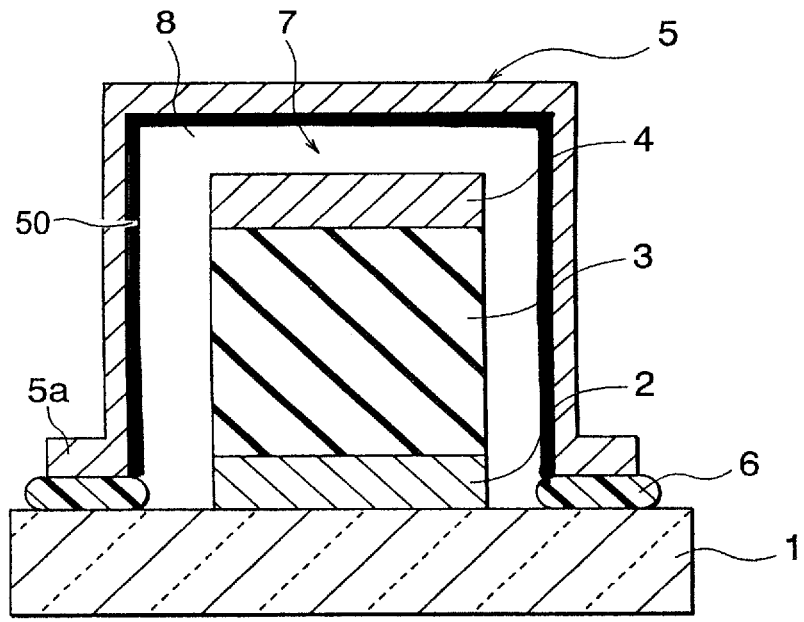
FIG. 1 is a cross-sectional view schematically showing a hermetic encapsulation package according to an embodiment of the present invention.

The present invention is to improve the sealing function of an organic EL device encapsulated by a sealing cap in consideration of the behavior of the gas confined within a sealed space. Encapsulated with a sealing cap, the element would be degraded by outer gases passing into the cap through the adhesive itself or through the boundaries between the adhesive and the substrate or between the adhesive and the sealing cap so long as no gases pass through the sealing cap itself and the support substrate itself. The passages through which gases pass could be blocked as much as possible to improve the sealing function of the organic EL device, however, it is also effective to relax the difference between the inner and outer pressures across the passages. Take an example where no cracking such as separation or the like has occurred on the aforementioned boundaries. Strictly speaking, gases passing through the adhesion portion show complicated behaviors and it is seemingly difficult to analyze the behaviors. However, in general, it is conceivable that gases dissolve in a cured adhesive according to the Henry's law and gases diffuse in the adhesive according to the Fick's law. Considering the behavior of a gas in accordance with these laws, the amount of gas passing through the adhesive increases with increasing difference in concentration of the gas across the adhesive, that is, between the pressures outside and inside the sealed space. The present invention is adapted to vary the volume of the sealed space to make use of relaxation of a change in pressure. In other words, the present invention is adapted to increase the volume of the sealed space when the temperature of the atmosphere in which the encapsulation package is placed rises to raise the inner pressure, and decrease the volume of the sealed space when the temperature lowers to lower the inner pressure. The pressure of a gas in the sealed space is proportional to the absolute temperature with the volume being kept constant as the so-called equation of state shows ($PV=nRT$, where P denotes the pressure, V the volume, n the number of moles of the gas, R the gas constant, and T the absolute temperature). Therefore, when the temperature T has raised, an increase in pressure P can be reduced by increasing the volume V. On the other hand, when the temperature T has lowered, a decrease in pressure P can be reduced by decreasing the volume V. Incidentally, the aforementioned equation of state is applied to ideal gases and thus van der Waals' equation for real gases has to be employed to state the actual behavior of the gas. However, the aforementioned trends are completely the same. Incidentally, assuming that an ideal gas is filled inside the sealed space, the percentage of a change in volume within the range of temperatures (from $-35°$ C. to $85°$ C.) according to the present invention is calculated to reduce the percentage of a change in pressure to about $3/4$ times. The percentage of a change is more preferably $1/2$ times or ideally zero times. In other words, no change in pressure ideally occurs for a change in temperature. However, a decrease of about $3/4$ times is just enough to make the effect of the present invention clearly noticeable. The present invention is to provide a hermetic encapsulation package which can reduce the amount of active gases such as moisture or oxygen, which pass through between the surrounding atmosphere and the sealed space, to enhance sealing effect of the sealed space and thus provides an improved resistance to thermal shock.

In the course of developing the present invention, the inventors did not make specific measurements of the amount of active gases passing through the sealed space of the hermetic encapsulation package. However, at an initial stage of developing the present invention, the inventors found the correlation between the amount of the active gases passing through the sealed space and the dark spots occurring in the pixel. Therefore, the inventors focused attention on reducing the molecules passing through between the surrounding atmosphere and the sealed space. Now, an additional explanation will be given below on this point. Two organic EL elements (having the same layer structure as example 1 to be described later) formed on substrates were placed in different sealed ovens each having a window without exposing the elements to the atmosphere. Incidentally, the sealed oven was filled with a dried nitrogen gas and the inner pressure was kept at the atmospheric pressure in advance. One of the ovens remained sealed, while dried nitrogen gas mixed with the atmospheric gas was allowed to flow into the other oven. The ratio between the dried nitrogen gas and the atmospheric gas was 98 to 2 in volume, and the temperature of the two ovens and the gas introduced therein was adjusted to 25° C. Thereafter, the organic EL element was lit up after every predetermined lapse of time to check for dark spots. No dark spots occurred on the element placed in the oven filled with the dried nitrogen gas. However, a number of dark spots were found on the element placed in the oven into which the gas mixed with the atmospheric gas was introduced and the number of the dark spots increased with time. This result caused the inventors to focus attention on reducing the amount of gases passing through between the surrounding atmosphere and the sealed space. The gases passing through between the surrounding atmosphere and the sealed space conceivably pass through the adhesive itself, the boundary between the adhesive and the sealing cap, and the boundary between the adhesive and the support substrate so long as no gases pass through the sealing cap itself and the support substrate itself. The object of the present invention is to provide a hermetic encapsulation package having a good resistance to thermal shock. In consideration of the fact that the amount of gases passing through the sealed space increases with increasing difference between the pressures inside and outside the sealed space, the inventors thought that such a mechanism that could relax a change in pressure inside the sealed space was effective as means for achieving the object. Thus, to relax a change in pressure inside the sealed space, the volume of the sealed space was made variable. That is, the present invention makes the volume of the sealed space variable to thereby relax a change in pressure of the space. This makes it possible to reduce the amount of gases passing through between the surrounding atmosphere and the sealed space.

Now, an organic EL device will be taken as an example to explain the embodiment of the present invention in detail with reference to the accompanying drawings. The hermetic encapsulation package for sealing the organic EL element according to the embodiments is suitable particularly for vehicle-mounted displays, which strictly require resistance to thermal shock, and thus full industrial use can be made thereof. Incidentally, the present invention is not limited to the organic EL device but can be applied to the encapsulation of other devices such as semiconductor devices or surface acoustic wave devices to which conventional hermetic encapsulation is applied.

In the present invention, it is to be understood that the room temperature is defined as 25° C. and simply referred to as the room temperature. Moreover, it is referred to as a change in volume by ±5% or more that the volume is increased by 5% or more at high temperatures and decreased by 5% or more at low temperatures.

FIG. 1 is a cross-sectional view schematically showing a hermetic encapsulation package according to the present invention. As shown in FIG. 1, an organic EL element 7 is formed on a support substrate 1 by successively forming a first electrode 2, an organic multi-layer portion 3 including at least a light-emitting layer, and a second electrode 4. In addition, a sealing cap 5 is bonded to the support substrate 1, for example, with an adhesive 6 such as epoxy resin of an ultra-violet curing type. On the sealing cap 5 according to this embodiment, there is provided a rim 5a for an adhesive to enhance the bonding strength between the cap and the support substrate 1. The rim 5a is bonded to the support substrate 1 with the adhesive 6. The organic multi-layer portion 3 may be provided with as many layers as desired as long as the organic multi-layer portion 3 includes a light-emitting layer. For example, the organic multi-layer portion 3 may comprise three layers of a hole transport layer, a light-emitting layer, and an electron transport layer, however, the present invention is not limited thereto. In addition, when carriers can be injected and transported only in the light-emitting layer to provide a good property, the organic multi-layer portion 3 can be formed of only one light-emitting layer. One of the first electrode 2 and the second electrode 4 is the anode and the other is the cathode. Any one of the anode and the cathode may be formed on the support substrate 1.

Moreover, a sealed space volume of the present invention refers to the volume of a space 8 defined by the sealing cap 5, the support substrate 1, and the adhesive 6 bonding them to each other. Incidentally, in FIG. 1, the height of the sealing cap 5 is illustrated to be roughly the same as the total thickness of the organic EL element 7. However, the figure is shown only schematically and the organic EL element 7 has a total film thickness actually negligibly thinner than the height of the sealing cap 5. Therefore, the volume of the space 8 is referred to as the sealed space volume defined by the sealing cap 5, the support substrate 1, and the adhesive 6 bonding them to each other.

In the present invention, the sealing cap 5 is deformed according to an increase and a decrease in pressure inside the sealed space 8, thus allowing the volume of the sealed space 8 to be varied. In this embodiment, the region of the sealing cap 5 opposite to the support substrate 1 is adapted to deflect according to an increase or a decrease in pressure inside the sealed space 8, thereby allowing the volume of the sealed space 8 to be varied. At higher temperatures, the sealing cap 5 is deflected outwardly relative to the sealed space 8, thereby resulting in an increase in volume of the sealed space 8. On the other hand, when the temperature is lowered, the sealing cap 5 is deflected inwardly relative to the sealed space 8, thereby resulting in a decrease in volume of the sealed space 8. Thus, the volume of the sealed space 8 is increased or decreased so as to relax a change in pressure caused by a change in temperature of the gas inside the sealed space 8. It is preferable that a decrease in volume is 5% or more at a temperature of −35° C. and an increase in volume is 5% or more at a temperature of 85° C., relative to the volume of the sealed space 8 at a temperature of 25° C. Moreover, at least part of the sealing cap 5 is preferably formed of an elastic material having a Young's modulus of 70 GPa or less.

Furthermore, there may be provided a gas barrier layer 50 either on both inner and outer sides of the sealing cap 5 or on one of the sides. The gas barrier layer may preferably have a Young's modulus of 70 GPa or less to be provided thereon. Incidentally, when heat sealing is available for bonding the sealing cap 5 to the support substrate 1, the adhesive 6 is not always required. In addition, the rim 5a for an adhesive is provided on the side wall of the cap by making the rim wider than the thickness of the cap to enhance the bonding strength as shown in FIG. 1. However, if the cap can be bonded to the support substrate 1 without the rim 5a, then the rim 5a is not necessary. Incidentally, it should be noted that the present invention provides not only insufficient effect but also no effect in some cases where a cap having a Young's modulus of 70 GPa or less is employed but the cap is insufficiently bonded to the support substrate.

In addition, the organic EL element is susceptible to moisture and therefore the organic EL element is sealed under a dried atmosphere. In addition, it is also conceivable that oxygen has an adverse effect on the element. It is particularly preferable to seal the element under an atmosphere of inert gases such as a dried nitrogen gas or a dried argon gas.

Furthermore, although FIG. 1 illustrate only one light-emitting pixel (an organic element), the present invention can be always applied to a matrix of a plurality of pixels.

Figure 2:
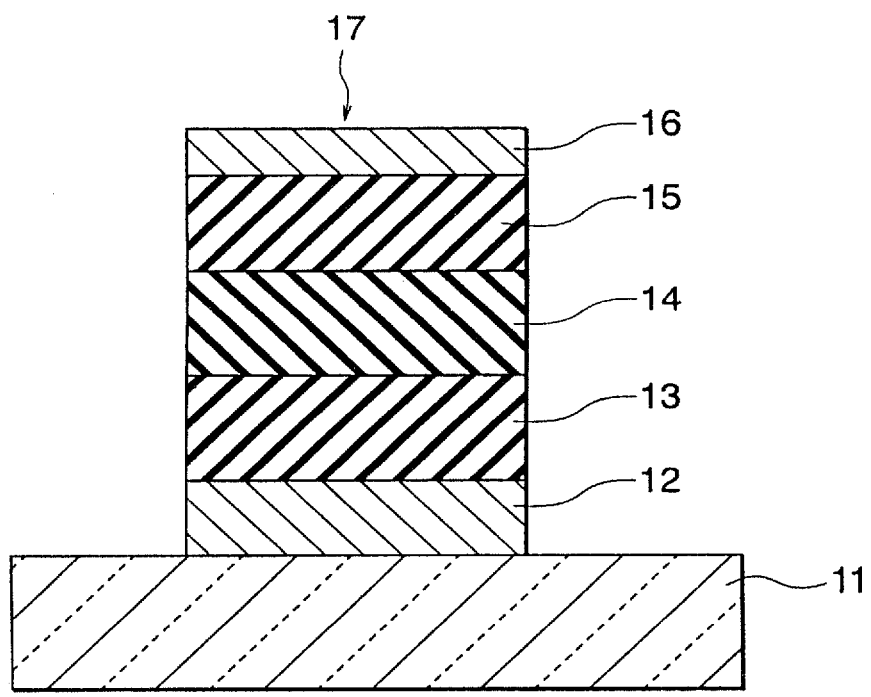
FIG. 2 is a cross-sectional view schematically showing the structure of a typical organic EL element.

Now, an organic EL element will be explained in more detail which is sealed within the hermetic encapsulation package according to this embodiment. As described above, no limitation is imposed on the structure of the element to realize the present invention, and accordingly the results obtained through previous research and development can be applied to the present invention. In other words, various known prior arts can be employed for the substrate, anode, cathode, the structure of the organic layer, the material of the organic layer and the like for forming the organic EL device. FIG. 2 is a cross-sectional view schematically showing the structure of a typical organic EL element used for this embodiment. As shown in FIG. 2, an organic EL element 17 is formed on a support substrate 11 by successively depositing a transparent anode 12, an organic layer comprising three layers of a hole transport layer 13, a light-emitting layer 14, and an electron transport layer 15, and a cathode 16.

For example, the support substrate 11 can be a plate-shaped, sheet-shaped, or film-shaped substrate formed of glass, plastics, quartz, or metal. In particular, preferably employed are those formed of transparent glass having a high light-emission permeability, transparent plastics such as polyester, polymethacrylate, or polycarbonate, or quartz.

For example, the materials of the transparent anode 12 include metals, alloys, electrically conductive compounds, and a mixture thereof, which have a high work function. More specifically, included are transparent materials or translucent materials having a dielectric property such as Au, CuI, ITO, $SnO_2$, or ZnO.

On the other hand, the materials of the cathode 16 include metals, alloys, electrically conductive compounds, and a mixture thereof, which have a low work function. More specifically, included are sodium, magnesium, silver, aluminum, lithium, indium, rare earth metals, and an alloy thereof.

Since the luminous efficiency can be improved by allowing the light emission to pass through an electrode, any one of the aforementioned anode and cathode is preferably made transparent or translucent.

The light-emitting layer 14 is formed usually of one or more organic luminescent materials which can efficiently transport and re-combine holes injected from the anode and electrons injected from the cathode, and emit light with efficiency through the re-combination. More specifically, the materials include tris-(8-hydroxyquinolate) aluminum ($Alq_3$), 4,4'-bis (2,2'-diphenylvinyl) biphenyl (DPVBi), and bis (10-hydroxybenzo[h]quinolate) beryllium ($BeBq_2$).

To improve the efficiency of light emission, the hole transport layer 13 and the electron transport layer 15 are used at the same time. The hole transport layer 13 employs materials which have a low ionization potential, high hole mobility, and improved stability, and in which impurities leading to traps are rarely generated during manufacture or in operation. For example, the materials include N,N'-diphenyl-N,N'-bis (3-methylphenyl)-1,1'-biphenyl-4,4'-diamine (TPD), N,N'-diphenyl-N,N'-bis (α-naphthyl)-1,1'-biphenyl-4,4'-diamine (α-NPD), and polyvinyl carbazole (PVK). These compounds can be used singly or may be mixed with each other as required.

In addition, to improve the adhesion of the organic layer to the anode to further improve the hole injection efficiency, a hole injection layer (not shown) may be interposed between the hole transport layer 13 and the anode 12. The hole injection layer may be formed, for example, of copper phthalocyanine (CuPc), 4,4',4"-tris (3-methylphenylamino) triphenylamine (m-MTDATA), or 4,4',4,"-tris (2-naphthylphenylamino) triphenylamine (2-TNATA).

On the other hand, the electron transport layer 15 employs materials which have a high electron affinity, high electron mobility, and improved stability, and in which impurities leading to traps are rarely generated during manufacture or in operation. More specifically, the materials include 2-(4-biphenylyl)-5-(4-t-butylphenyl)-1,3,4-oxaziazole (PBD), 3-(3-biphenylyl)-4-phenyl-5-(4-t-butylphenyl)-1,2,4-triazole (TAZ), and tris-(8-hydroxyquinolate) aluminum ($Alq_3$). Here, when the electron transport layer is formed of PBD, the electron injection layer can be formed of $Alq_3$.

Furthermore, as described above, it is possible to use one of or both carrier transport layers also as the light-emitting layer or employ three or more layers. More specifically, such configurations are possible as anode/light-emitting layer/cathode; anode/light-emitting layer/electron transport layer/cathode; anode/hole transport layer/light-emitting layer/cathode; anode/hole transport layer/light-emitting layer/electron transport layer/cathode; anode/hole injection layer/hole transport layer/light-emitting layer/electron transport layer/cathode; or anode/hole transport layer/light-emitting layer/electron transport layer/electron injection layer/cathode.

Each layer is not necessarily formed of a compound of one type. One or more materials may be mixed with each other as required. More specifically, a so-called doped type light emission may be employed by doping another luminescent material to the light-emitting layer to allow the doped material to emit light. In addition, to improve heat resistance, polymers may be mixed with each layer as a matrix material. Incidentally, the support substrate may be formed on the cathode side and light may be allowed to emit in any directions. The element shown in FIG. 2 is fabricated on the support substrate in the order of the anode, hole transport layer, light-emitting layer, electron transport layer, and cathode. The deposition of the layers in that order is relatively simple, however, the present invention is not limited thereto. To provide the support substrate on the side of the cathode, the cathode, electron transport layer, light-emitting layer, hole transport layer, and anode are deposited in that order. This method is simple, however, the present invention is not limited thereto.

Now, the materials that can be used for the sealing cap will be explained below. The materials used for the sealing cap include metals such as aluminum or magnesium alloys, plastics such as polyethylene terephthalate, polycarbonate, polystyrene, nylon, or polyvinyl chloride, and their composites. In particular, aluminum is preferably used since it has a low Young's modulus and can be readily formed, providing a good gas barrier property. The sealing cap is not necessarily formed of one of these materials alone. For example, the side and upper surface of the sealing cap can be formed of different materials. At this time, the upper surface of the sealing cap can be deflected on a priority basis by forming the upper surface of a material lower in Young's modulus than the material used for the side of the cap. Alternatively, the upper surface can be made thinner and the side made thicker, thereby allowing the upper surface of the sealing cap to be deflected on a priority basis.

Figure 3:
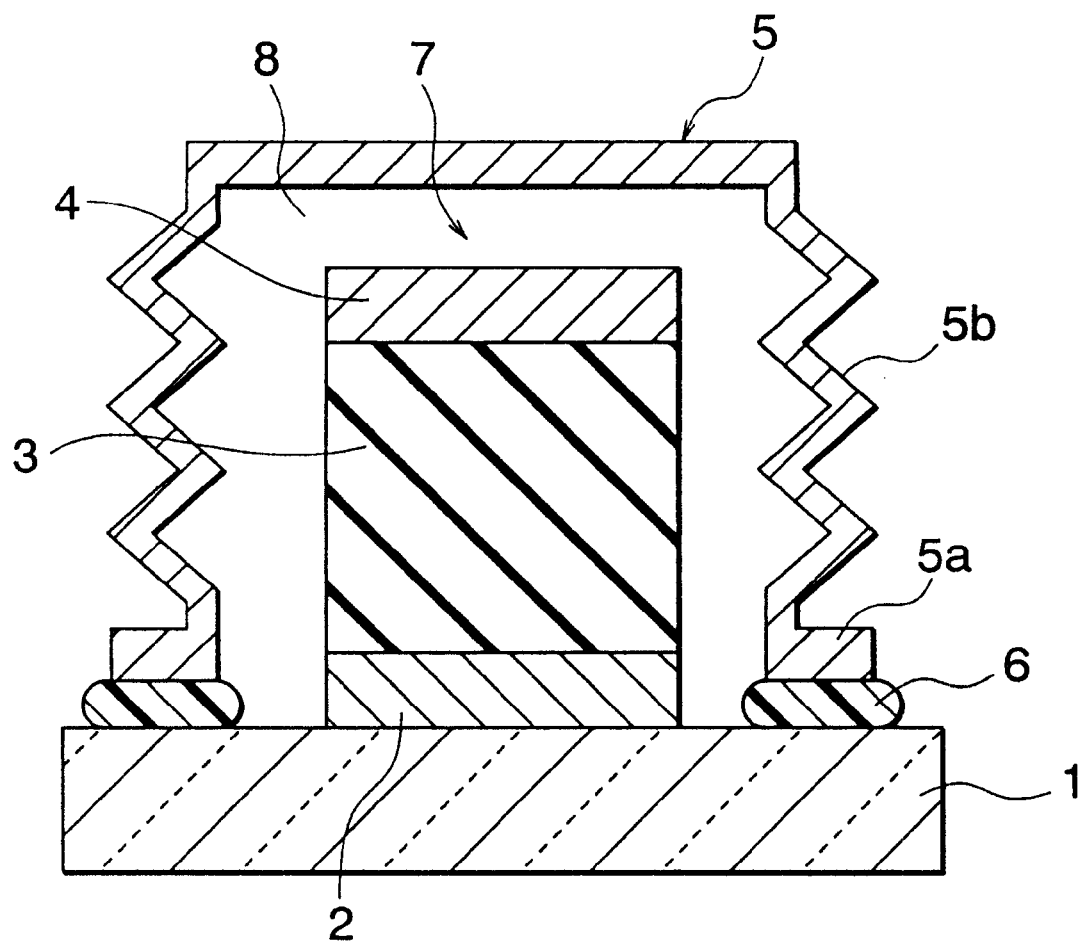
FIG. 3 is a cross-sectional view schematically showing a modified example of the hermetic encapsulation package according to the embodiment of the present invention.

FIG. 3 is a cross-sectional view showing a hermetic encapsulation package according to a modified example of this embodiment. As shown in FIG. 3, on part of the sealing cap, there can be provided bellows 5b having a spring property. Formation of the bellows 5b facilitates the deformation of the sealing cap.

Now, adhesives will be explained below which can be employed for the present invention The adhesives 6 available include a heat curing resin or an ultraviolet curing resin. Since the organic EL element is susceptible to moisture and alcohol-based gases, materials that have low permeability and provide less amount of out-gas are required. Furthermore, the organic EL element 7 has poor resistance to heat and is therefore preferably cured at low temperatures. For this reason, the ultraviolet curing resin is preferred. The ultraviolet curing resins are divided into acrylic and epoxy resins. The epoxy resin is inferior in curing property to the acrylic resin. However, the epoxy resin is preferable because of superiority to the acrylic resin in handleability (pot life and odor), in stability of dimension upon curing, and in property of the cured product (resistance to heat and moisture). More particularly, resins such as TB3025G and 30Y-296G manufactured by Three Bond Co., Ltd. are preferable in that they can be cured at room temperature.

Now, the materials that can be used for the gas barrier layer (not shown) will be explained below. The materials for the gas barrier layer include aluminum, aluminum oxide, silicon oxide, and silicon nitride. Since the gas barrier layer is thinner than the sealing cap 5, a gas barrier material having a high Young's modulus could be used. However, like the material of the sealing cap 5, aluminum has a Young's modulus of 70 GPa or less and therefore preferably will not interfere with the deflection of the sealing cap. The gas barrier layer can be formed by sputtering or vapor deposition on both or one of the surfaces of the sealing cap material prior to the shaping of the sealing cap 5. Alternatively, the gas barrier layer may be formed in the same manner on both or one of the surfaces of the sealing cap material after the shaping of the sealing cap 5. Alternatively, the gas barrier layer can also be formed by vapor deposition outside the sealing cap 5 after the sealing cap 5 has been bonded to the support substrate 1. Incidentally, in a case where plastics are used for the support substrate 1, a gas barrier layer can be formed on the support substrate 1 as required since the support substrate 1 itself may be conceivably gas permeable.

Figure 4A:
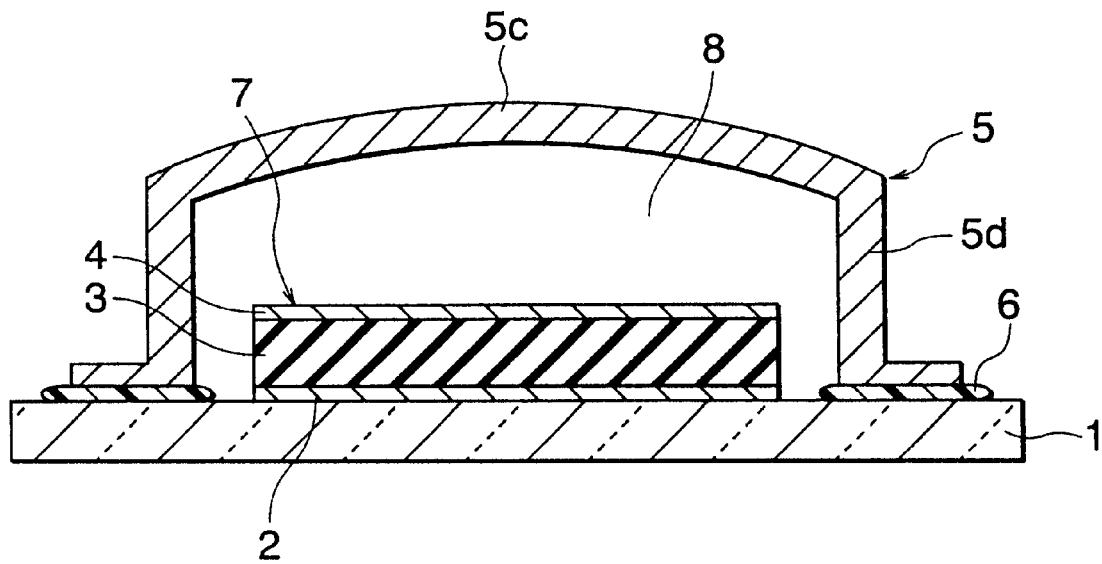
FIGS. 4A and 4B are views showing the behavior of the hermetic encapsulation package according to the embodiment of the present invention, 4A and 4B being a cross-sectional view schematically showing the package at a high temperature and a low temperature, respectively.
Figure 4B:
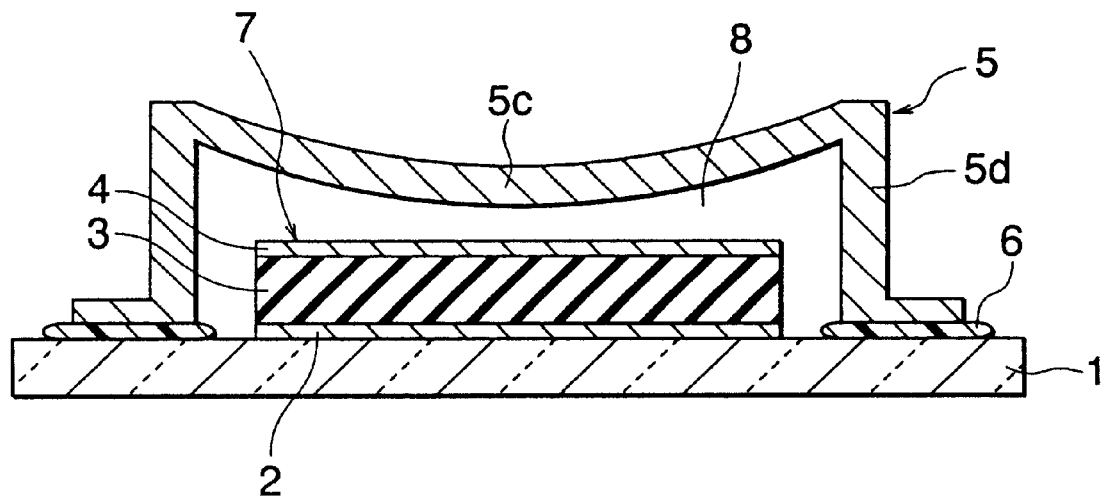

Now, the behavior of this embodiment will be explained below. FIGS. 4A and 4B are views showing the behavior of the hermetic encapsulation package according to this embodiment, 4A and 4B being a cross-sectional view schematically showing the behavior at a high temperature and a low temperature, respectively. As shown in FIG. 4A, the gas inside the sealed space 8 is expanded at high temperatures, thereby deflecting the sealing cap 5 outwardly and thus causing an increase in volume of the space 8. This makes it possible to provide less increase in pressure of the gas inside the sealed space 8.

On the other hand, as shown in FIG. 4B, the gas inside the sealed space 8 is contracted at low temperatures, thereby deflecting the sealing cap 5 inward and thus causing a decrease in volume of the space 8. This makes it possible to mitigate the decrease in pressure of the gas inside the sealed space 8. Here, the deflection of the sealing cap 5 occurs substantially on an upper surface portion 5c opposite to the support substrate 1. This is because the organic EL element 7 is very thin in thickness and a side portion 5d corresponding to the height of the sealing cap 5 is hardly deflected.

Now, the effect of the present invention will be explained. As described above, it is to be understood that elements such as the organic EL element are hermetically encapsulated in an elastic material which deforms reversibly according to an increase or a decrease in volume of the sealed space so as to ensure the sealed space variable within the aforementioned range without permitting the passage of air therethrough. A percentage of variation in volume of the sealed space of ±3% or more is just enough to admit the effect of the present invention. However, the effect of the present invention is brought to the fore as the percentage becomes ±5% or more. It is most preferable to provide a change in the volume for the sealed space so as to allow the inner pressure of the encapsulated space (sealed space) to remain unchanged with changing temperatures.

Now, described below is the evidence for the fact that the effect of the present invention is brought to the fore at a percentage of variation in volume of ±5% or more.

First, a preliminary test setup was prepared which was able to vary the volume of the sealed space of an organic EL device while sealing out the surrounding atmosphere. Then, with this package, the correlation between the percentage of the variable sealed space and the durability of the element was studied. Incidentally, the durability was estimated with the percentage of dark spots occurring in the light-emitting surface of the element. The structure and operation of the package and the procedure of the experiment will be outlined below.

Figure 5:
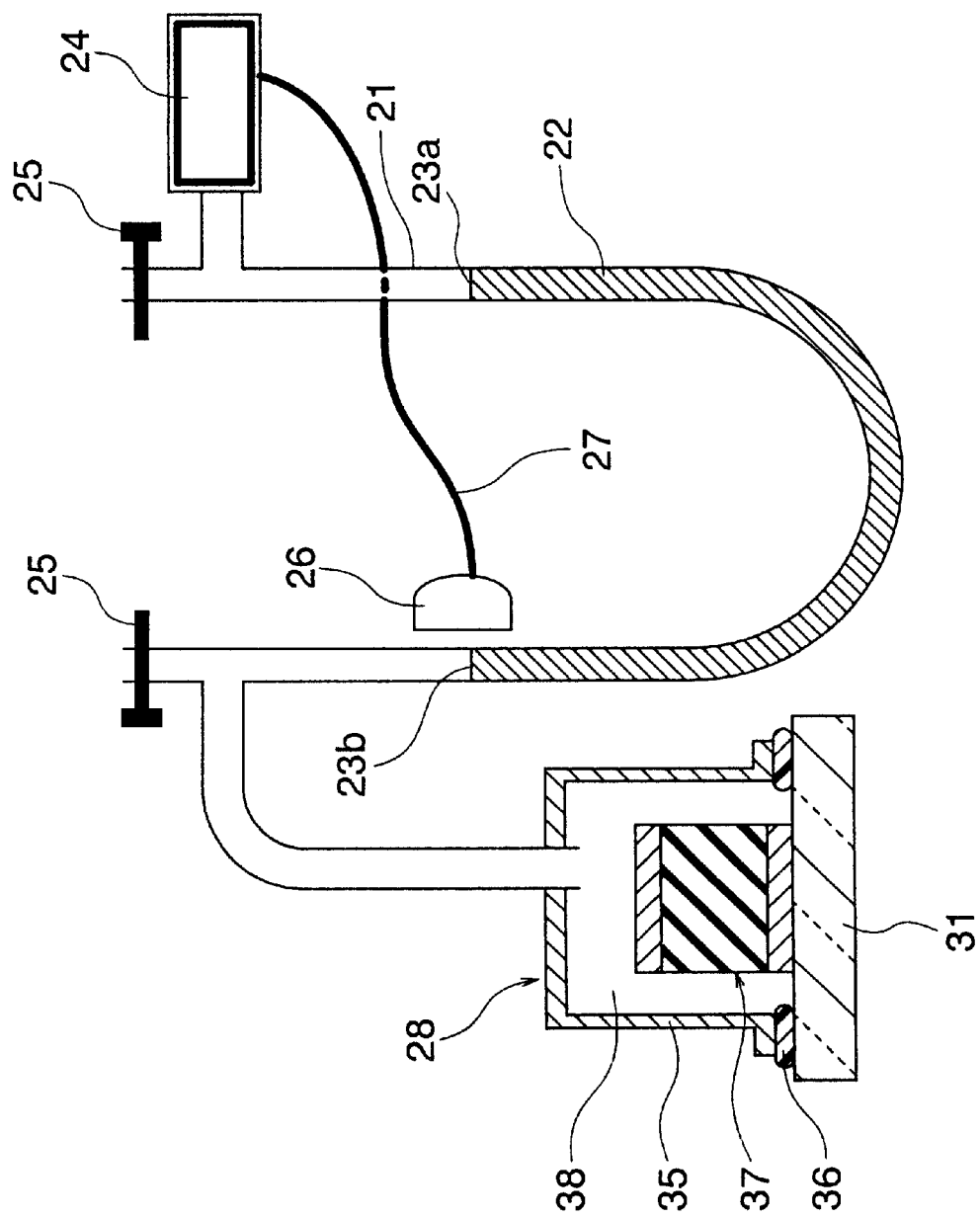
FIG. 5 is a side view schematically showing the configuration of a preliminary test setup for evaluating a sealed volume space of a package according to the present invention.

First, an experimental setup is explained below. FIG. 5 is a side view schematically showing the configuration of the preliminary test setup. As shown in FIG. 5, a pressure regulator 24 comprising a pressurizing and pressure-reducing mechanism is connected to one of the openings of a U-shaped glass tube 21. The other opening is connected to a sealed space 38 defined by a sealing cap 35 and support substrate 31 of an organic EL device 28. In the glass tube 21, there is mercury 22. On both ends of the glass tube 21, there are provided gas vent cocks 25 that can be selectively opened and closed. Consideration is given to the space, where no mercury 22 is filled, from a liquid level 23a of the mercury 22 on the side to which the pressure regulator 24 of the glass tube 21 is connected to the end portion thereof. Consideration is also given to the space, where no mercury 22 is filled, from a liquid level 23b of the mercury 22 on the side to which the organic EL device 28 is connected to the end portion thereof. The pressure of these spaces can be made the same as the external pressure by opening or closing the gas vent cocks 25. The pressure regulator 24 is connected via a cable 27 with a liquid level monitor 26 for monitoring the liquid level 23a of the mercury 22 on the side to which the organic EL device 28 is attached. Here, the cable 27 transmits the information of the liquid level monitor 26 to the pressure regulator 24. In addition, between the U-shaped glass tube 21 and the pressure regulator 24 and between the U-shaped glass tube 21 and the organic EL device 28, there are provided trapping apparatuses (not shown) for preventing the mercury 22 from flowing out from the glass tube 21 to the pressure regulator 24 and the organic EL device 28, respectively.

With this experimental setup, the mercury 22 is first poured into the U-shaped glass tube 21. Then, with the pressure regulator 24 comprising a pressurizing and pressure-reducing mechanism, connected to the one opening, the liquid level 23a of the mercury 22 is varied from the one side to vary the liquid level 23b of the other side. Piping is installed from the other opening of the glass tube 21 to communicate with the sealed space (encapsulated space) 38 of the organic EL device 28. Incidentally, after the glass tube 21 has been connected to the pressure regulator 24 and the organic EL device 28, the pressure of the space filled with no mercury 22 in the U-shaped glass tube 21 was made the same as the eternal pressure with the open/close gas vent cocks 25 provided on both ends of the glass tube 21. The experiment was started after all parts were attached in place and a leakage test was carried out to confirm no leakage in the setup.

Now, the experimental method will be explained below. First, the organic EL device 28 was prepared which is similar to one according to example 1, described later, but different therefrom in that the sealing cap 35 is formed of tungsten and has a thickness of about 0.5 mm and a Young's modulus of about 410 GPa. The temperature of the organic EL device 28 was varied from −35 to 85° C. to measure changes in the internal volume nondestructively and ultrasonically. The percentage of the change was found to be about ±0.2%, which was negligibly small. Thus, it was confirmed that the percentage of change in volume of the sealed space 38 could be substantially assumed to be zero within the range of temperature.

Subsequently, the one end of the U-shaped glass tube 21 was connected to the sealed space 38 of the organic EL device 28. With this configuration, changes in volume of the sealed space 38 could be known by monitoring the liquid level 23b of the mercury 22. Incidentally, the volume of the sealed space 38 equals to (space volume enclosed by the sealing cap 35 and the support substrate 31)+(the internal volume of the piping from the opening of the sealing cap 35 to the U-shaped glass tube 21)+(the internal volume from the liquid level 23b to the cock 25 in the U-shaped glass tube 21 on the side to which the organic EL device 28 is attached). The sealed space 38 was calculated based on the shape of each of the parts used. Upon calculation, each of the layers (each of the electrodes and each organic layer) forming an organic EL device 37 was negligibly thin in thickness, compared with the height of the sidewall of the sealing cap 35, and therefore neglected. The other end of the U-shaped glass tube 21 was connected with the pressure regulator 24. After the connection of both ends of the U-shaped glass tube 21, both gas vent cocks 25 were opened or closed simultaneously to allow the pressure of both portions filled with no mercury 22 to agree with that of the surrounding atmosphere. Incidentally, a series of these operations were carried out in a dried nitrogen atmosphere at 25° C. at one atmospheric pressure, with care being taken so as not to cause dark spots to occur in the pixels of the organic EL device 28 during the operations. Thereafter, a commercially available constant temperature oven was used to carry out a thermal shock test of 1000 cycles. As for the temperature profile, temperatures of 85° C. and −35° C. were maintained for 20 minutes, respectively, and the temperatures were raised or lowered in 20 minutes, respectively. The test was started at the step for raising the temperature from the room temperature to 85° C. During the thermal shock test, the pressure regulator 24 was activated to vary the volume of the sealed space 38. Incidentally, a beaker filled with a good amount of water was always placed inside the constant temperature oven to keep the interior of the oven at high humidity. The relative humidity was 70% or more inside the oven immediately after the temperature of 85° C. was maintained for 20 minutes. After the thermal shock test was completed, the pixel was lit to observe dark spots occurring in the light emission portion. The pixel was lit up only during the measurement of dark spots but turned off otherwise. During the series of tests, the liquid level monitor 26 was used to monitor the liquid level 23b and automatically control the pressure regulator 24 based thereon so as to always keep the percentage of change in volume within a predetermined value (which means, for example with the value equal to ±3% or less, to keep a decrease in volume within 3% or less at low temperatures and an increase in volume within 3% or less at high temperatures relative to the room temperature).

Figure 6:
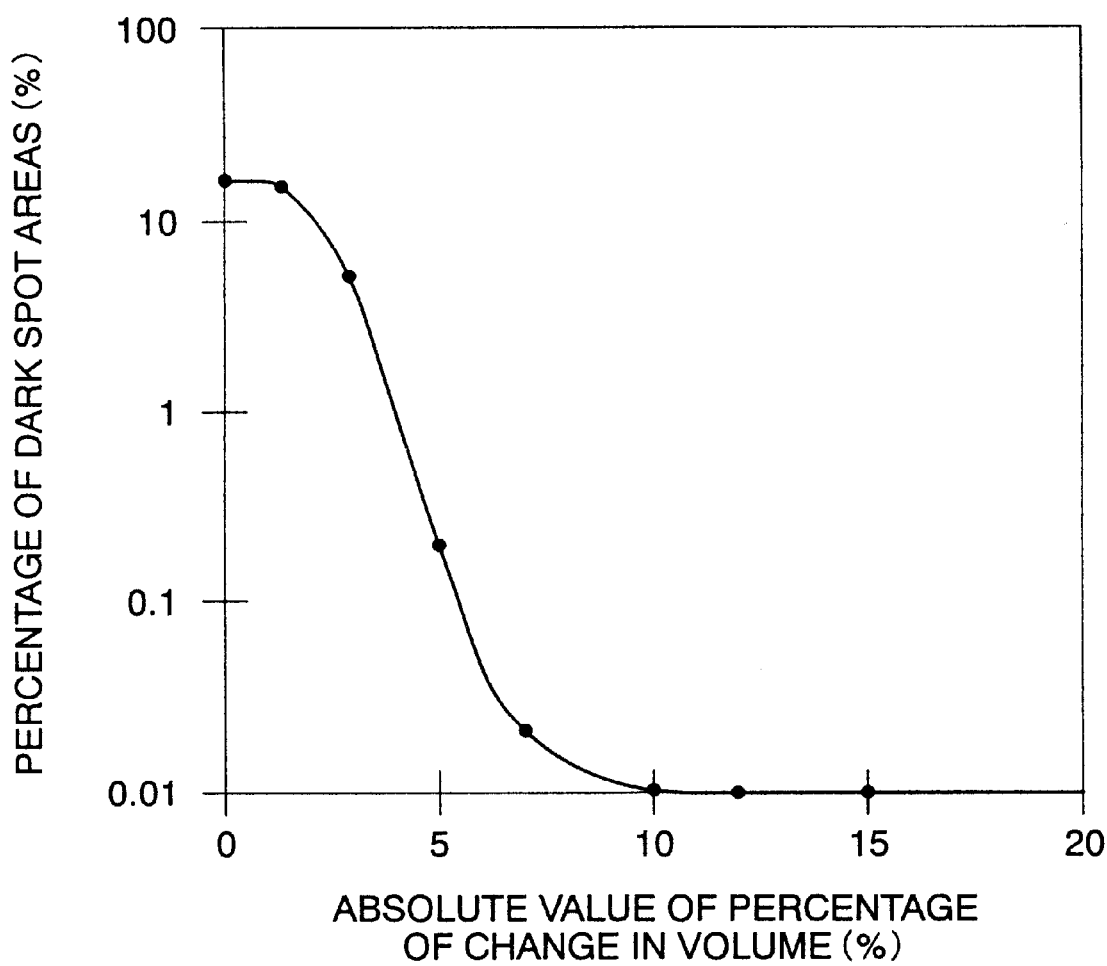
FIG. 6 is a semi-log plot showing the correlation between the absolute value of the percentage of variation in volume versus the percentage of dark spots in the sealed volume space, obtained with preliminary test setup for evaluating the sealed volume space of the package according to the present invention.

FIG. 6 is a semi-log plot showing the correlation between the absolute value of the percentage of variation in volume versus the percentage of dark spots in the sealed volume space, obtained with preliminary test setup for evaluating the sealed volume space of the package according to the present invention. The percentage of dark spot areas is defined by (the total of dark spot areas)/(area of pixels). A direct current voltage of 10V was applied to ten pixels randomly chosen to be lit up in a dark room, and the pixels were photographed with a CCD camera. Then, the images provided by the CCD camera were analyzed to obtain an average value and determine the percentage of dark spot areas.

As shown in FIG. 6, with the absolute value of a percentage of a change in volume being equal to 5% or more, the percentage of dark spot areas becomes about $\frac{1}{100}$ or less when compared with the case of zero change in volume. Thus, a noticeable effect was provided. From the aforementioned results, it can be found that the effect of the present invention becomes noticeable with a change in volume ±5% or more as described above.

In addition, the elastic material used for the sealing cap of the present invention has preferably a Young's modulus of 70 GPa or less to positively provide a desired change in volume. For example, a much lower Young's modulus of about 10 GPa is more preferable, however, the present invention provides a noticeable effect by a Young's modulus higher than that so long as the modulus is 70 GPa or less. Even with a material having a Young's modulus of 70 GPa or more, the aforementioned sealed space volume could be conceivably changed by making the thickness of the cap significantly thin. However, this would cause lack of easiness in machining and handling, thereby leading to an increase in cost and the number of steps in the process.

The sealing cap is typically bonded with adhesive or the like to the outer periphery of the pixel of the support substrate having the element formed thereon. The present invention can employ a similar technique as well. Like in this embodiment, to fix the cap, a rim portion for an adhesion may be employed to provide an adhesion surface. Adhesives to be used are not limited to a particular one so long as it provides sufficient adhesive strength. Thus, various types of known adhesives may be used, however, care may be taken so as to prevent damage to the element upon curing. For example, for an adhesive of ultraviolet curing type, it is necessary to shield the element against the ultraviolet rays. Furthermore, for an adhesive of heat curing type, it is necessary to take care so as not to directly expose the organic EL element to heat in order to prevent the degradation of the organic EL element. After the cap has been sealed, gases may go therein conceivably through the cured adhesive, or boundaries between the adhesive and cap or the adhesive and support substrate so long as no gases go into the package through the sealing cap itself or the support substrate itself. Therefore, not only adhesives of low out-gas but also caps and adhesives of low gas permeability have to be used. Moreover, high adhesion must be provided between the adhesive and the cap and between the adhesive and the substrate. This is conceivably related to the adhesive strength of the adhesive and therefore a critical factor in conjunction with low out-gas and low gas permeability. In addition, when a sealing cap is used which is formed of a material having a high affinity for the substrate, both can be heat-sealed.

When bonded with adhesive or the like, the sealing cap is not limited in shape to a particular one so long as the volume of the sealed space can be varied within the aforementioned range. However, the structure of the cap should be adapted such that the inner wall of the sealing cap does not directly contact with the element when the sealed volume is decreased at low temperatures. More specifically, the cap should have a surface shaped to accommodate the pixels formed on the substrate and a height enough to prevent the cap from touching the pixels when the surface is deflected upon a decrease in volume of the sealed space. However, the cap should be provided with the aforementioned surface to such an extent that the surface does not impair the handling convenience and the portability of the cap. More specifically, the height may be from 0.1 mm to 50 mm, more preferably form 0.3 mm to 10 mm. However, the height will vary depending on the size and shape of the light-emitting surface and therefore should be determined through a trial model of the cap. The thickness of each portion of the cap is not limited to a particular value. The cap should have a thickness enough to prevent a gas from passing therethrough. However, care should be taken not to make the thickness too thick since an excessive thickness would make it impossible to provide sufficient deflection for the cap to relax the change in inner pressure thereof. More specifically, the thickness may be from 0.1 mm to 10 mm, more preferably form 0.2 mm to 5 mm. However, the thickness should be determined through a trial model of the cap considering the gas permeability and the Young's modulus of the constituent material.

In the present invention, after the sealing cap has been formed of plastics or the like, a gas barrier layer may be provided to reduce the gas permeability. The gas barrier layer can be formed either on both or one of the surfaces of the sealing cap. When provision of the gas barrier layer allows the gas barrier property to be maintained by the action of the layer, the material of the sealing cap itself is not required of the gas barrier property. It is necessary to design the cap so as to allow a change in volume, described above, with the gas barrier layer being provided thereto. Accordingly, it is preferable to employ the same material of a Young's modulus of 70 GPa or less as that used for the sealing cap.

EXAMPLES

Now, the effects provided by the examples of actually manufactured hermetic encapsulation package according to the present invention will be explained below in comparison with comparative examples which depart from the scope of the present invention. The present invention is not limited to the following examples but may be embodied in other specific forms without departing from the scope of the present invention.

Example 1
<Fabrication of Organic EL Panel>

Figure 7:
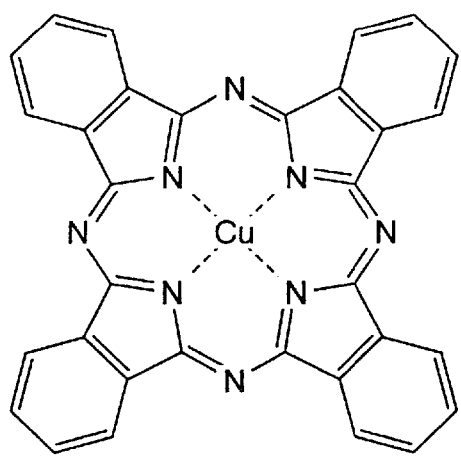
FIG. 7 is the structural formula of copper phthalocyanine used as a hole injection material in Example 1 of the present invention.
Figure 8:
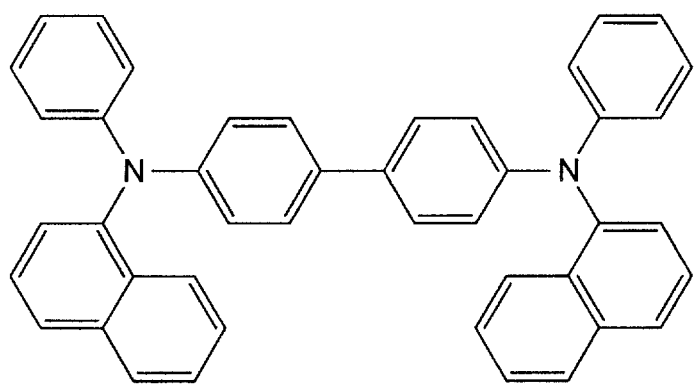
FIG. 8 is the structural formula of N,N'-diphenyl-N,N'-bis($\alpha$-naphthyl)-1,1'-biphenyl-4,4'-diamine, used for a hole transport material in Example 1 of the present invention.
Figure 9:
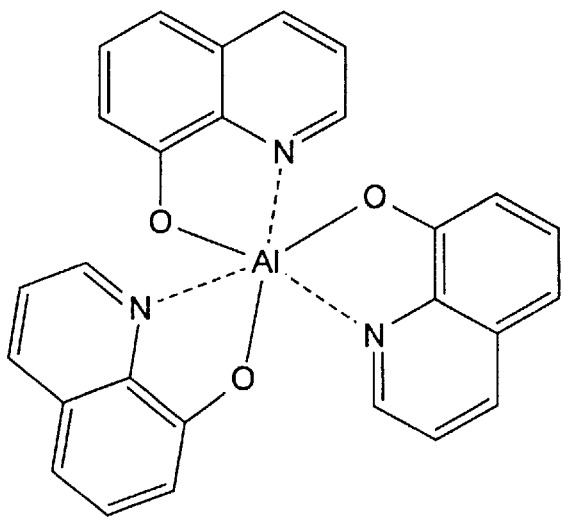
FIG. 9 is the structural formula of tris-(8-hydroxyquinolate) aluminum, serving simultaneously as an electron transport material and a luminescent material in Example 1 of the present invention.

ITO (indium tin oxide) was deposited by sputtering on a glass substrate of thickness 1.1 mm to provide a sheet resistance $R_s$ of 15 Ω/□. Then, unnecessary portions were removed by etching to form a stripe by patterning, and thus a support substrate with ITO was prepared. Hereinafter, the support substrate will also be simply referred to as a substrate. The substrate was washed ultrasonically successively in neutral detergent and isopropyl alcohol, then thoroughly dried, and thereafter subjected to UV-ozone washing for five minutes while being heated up to a temperature of 110° C. Then, the substrate was quickly fixed a substrate folder inside a vacuum chamber of a commercially available vacuum evaporator and then pumped down to a vacuum in no time. Incidentally, as the evaporation sources, provided inside the vacuum chamber were boats each of which contains the following sources. That is, the copper phthalocyanine (CuPc) of 100 mg, shown in FIG. 7, was used as a material of the hole injection layer. The N,N'-diphenyl-N, N'-bis (α-naphthyl)-1,1'-biphenyl-4,4'-diamine (α-NPD) of 100 mg, shown in FIG. 8, was used as a material of the hole transport layer. The tris-(8-hydroxyquinolate) aluminum ($Alq_3$) of about 1 g, shown in FIG. 9, was used as a material of the electron transport layer which also serves as the light-emitting layer. In addition, aluminum of about 1 g and lithium of 100 mg were used as a material of the cathode. Incidentally, the boats formed of molybdenum were used for the organic materials (CuPc, α-NPD, and $Alq_3$), while the boats formed of tungsten were used for the cathode materials. After a vacuum level of $10^{-5}$ Pa has been reached, each of the evaporation sources was heated up to be successively deposited as a hole injection layer of copper phthalocyanine 25 nm in thickness on the ITO side of the substrate with the ITO, as a hole transport layer of α-NPD 25 nm in thickness, and as a light-emitting layer, which also serves as an electron transport layer, of $Alq_3$ 70 nm in thickness. The rate of evaporation of each layer was approximately 0.2 nm/sec.

Thereafter, the boats of tungsten each containing aluminum and lithium were heated up at the same time to form the cathode of an alloy composed of aluminum and lithium. At this time, the rate of deposition of aluminum was set to 1 nm/sec and the amount of lithium was set to 0.1% in mass relative to the aluminum. The layers were 200 nm in thickness, however, the layer, on the side of the electron transport layer, containing lithium was made 100 nm in thickness by stopping heating up of the evaporation source of lithium in its course. Incidentally, in a series of operations, 40 by 40 light-emitting pixels, each having a size of 2 mm by 2 mm, were formed in an x-y matrix using two types of masks each for the organic layers and the cathode. A spacing of 2 mm between pixels was provided in both x and y directions, with the pixels being formed in an area of 160 mm by 160 mm. A vacuum was maintained even upon replacement of the masks, and thus the organic layers and the cathode were all formed in a vacuum. The organic EL panel prepared as described above was transferred into a dried nitrogen atmosphere without being exposed to the surrounding atmosphere to perform the following sealing process.

<Sealing of the Organic EL Panel>

Formed was a cubic container type sealing cap of aluminum about 0.5 mm in thickness. The surface to be made parallel to the substrate when the cap was secured thereto was made in a size of 165 mm by 165 mm, which is wider than the pixel portion by 2.5 mm at either side so as to accommodate the pixel portion on the organic EL panel prepared previously. The sealing cap was made 4 mm in depth and a rim of 2 mm was provided thereto for the application of adhesive. The Young's modulus of the aluminum used was measured to be 69 to 70 GPa. The sealing cap and an ultraviolet curing adhesive (30Y-296G manufactured by Three Bond Co., Ltd.) were used to seal the organic EL panel prepared previously. The width for bonding was made 2 mm, which was the same as the rim for an adhesive. Incidentally, the sealing cap and the adhesive were accommodated beforehand inside a glove box having, in the chamber thereof, an adhesive dispenser, an ultraviolet light source for curing, and an alignment unit. Thus, without exposing the panel to the surrounding atmosphere even after the deposition of layers was completed, the sealing process was carried out in a dried nitrogen gas atmosphere at a temperature of 25° C. at one atmospheric pressure. Shielding masks were used to cover necessary portions so as to prevent the ultraviolet for curing the adhesive from damaging the organic films.

Example 2

An organic EL panel was fabricated under the same conditions as those of Example 1 except that the sealing cap was formed of a magnesium alloy (MP5), and then the same sealing process was carried out. The Young's modulus of the magnesium alloy used was 40 to 41 GPa.

Example 3

An organic EL panel was fabricated under the same conditions as those of Example 1 except that the sealing cap was formed of polyethylene terephthalate and a gas barrier layer of aluminum 50 μm in thickness was deposited on the whole inner wall (including the rim for an adhesive) by vapor deposition, and then the same sealing process was carried out. The Young's modulus of the polyethylene terephthalate itself used was 1.5 to 2.5 GPa.

Example 4

An organic EL panel was fabricated under the same conditions as those of Example 1 except that the sealing cap was formed of polycarbonate and a gas barrier layer of aluminum 50 μm in thickness was deposited on the whole cap inner wall (including the rim for an adhesive) by vapor deposition, and then the same sealing process was carried out. The Young's modulus of the polycarbonate itself used was 1.8 to 2.8 GPa.

Example 5

An organic EL panel was fabricated under the same conditions as those of Example 1 except that the sealing cap was formed of polystyrene and a gas barrier layer of aluminum 50 μmin thickness was deposited on the whole cap inner wall (including the rim for an adhesive) by vapor deposition, and then the same sealing process was carried out. The Young's modulus of the polystyrene itself used was 2.7 to 3.5 GPa.

Example 6

An organic EL panel was fabricated under the same conditions as those of Example 1 except that the sealing cap was formed of nylon-6,6 and a gas barrier layer of aluminum 50 μm in thickness was deposited on the whole cap inner wall (including the rim for an adhesive) by vapor deposition, and then the same sealing process was carried out. The Young's modulus of the nylon-6,6 itself used was 2.8 to 3.5 GPa.

Example 7

An organic EL panel was fabricated under the same conditions as those of Example 1 except that the sealing cap was formed of polyvinyl chloride and a gas barrier layer of aluminum 50 μm in thickness was deposited on the whole cap inner wall (including the rim for an adhesive) by vapor deposition, and then the same sealing process was carried out. The Young's modulus of the polyvinyl chloride used was 2.6 to 3.4 GPa.

Comparative Example 1

An organic EL panel was fabricated under the same conditions as those of Example 1 except that the sealing cap was formed of soda glass, and then the same sealing process was carried out. The Young's modulus of the soda glass used was 75 to 78 GPa.

Comparative Example 2

An organic EL panel was fabricated under the same conditions as those of Example 1 except that the sealing cap was formed of stainless steel (SUS304), and then the same sealing process was carried out. The Young's modulus of the stainless steel (SUS304) used was 198 to 205 GPa.

The temperature of the hermetic encapsulation packages (organic EL devices) fabricated in the aforementioned processes according to Examples 1 to 7 and Comparative Examples 1 and 2 was varied from −35 to 85° C. to measure the volume of the sealed space and the change in volume nondestructively. As a result, it was found that the change in volume of the sealed space was caused by the deflection of the upper surface of the cap opposite to the support substrate. Incidentally, the measurement was repeated five times for each sample. Thereafter, a commercially available constant temperature oven was used to carry out a thermal shock test from −35° C. to 85° C., and then dark spots occurring on the light-emitting portion of the element were observed. Incidentally, a beaker filled with a good amount of water was always placed inside the constant temperature oven to keep the interior of the oven at high humidity. The relative humidity was 70% or more inside the oven immediately after the temperature of 85° C. was maintained for 20 minutes. The element was not lit up during the thermal shock test. As for the temperature profile of the thermal shock test, temperatures of 85 and 35° C. were maintained for 20 minutes, respectively, and the temperatures were raised or lowered in 20 minutes, respectively. Incidentally, the test was started at the step for raising the temperature from the room temperature to 85° C.

The Young's modulus of the materials used, the percentage of change in volume, and the percentage of the dark spot area after 1000 cycles are shown in Table 1. Incidentally, as mentioned in the foregoing, the percentage of dark spot areas is defined herein by (the total of dark spot areas)/(area of pixels). To determine the percentage, a direct current voltage of 10V was applied to ten pixels randomly chosen to be lit up in a dark room, and the pixels were photographed with a CCD camera. Then, the images provided by the CCD camera were analyzed to obtain an average value and determine the percentage of dark spot areas. Incidentally, the measurement of the Young's modulus was carried out for five samples from each material with a commercially available device for measuring modulus of elasticity.

TABLE 1

| | Change in volume (%) | | | Percentage |
| --- | --- | --- | --- | --- |
| | +85° C. (Increase) | −35° C. (Decrease) | Young's modulus (Gpa) | of dark spot area |
| Example 1 | 6–8 | 6–8 | 69–70 | 0.1 |
| Example 2 | 7–8 | 6–8 | 40–41 | 0.0 |
| Example 3 | 9–15 | 9–13 | 1.5–2.5 | 0.0 |
| Example 4 | 9–12 | 10–13 | 1.8–2.8 | 0.1 |
| Example 5 | 8–12 | 9–13 | 2.7–3.5 | 0.0 |
| Example 6 | 8–12 | 9–14 | 2.8–3.5 | 0.0 |

TABLE 1-continued

|  | Change in volume (%) | | Young's modulus (Gpa) | Percentage of dark spot area |
| --- | --- | --- | --- | --- |
|  | +85° C. (Increase) | −35° C. (Decrease) | | |
| Example 7 | 9–13 | 10–15 | 2.6–3.4 | 0.1 |
| Comparative Example 1 | 2–3 | 2–3 | 75–78 | 10 |
| Comparative Example 2 | 1–2 | 1–2 | 198–205 | 14 |

As can be seen clearly from Table 1 above, according to the present invention, the organic EL element is sealed with a sealing cap which deforms according to a change in pressure inside the sealed space caused by a change in temperature. This allows the volume of the sealed space to increase or decrease to relax a change in pressure, thereby providing reduced percentage of dark spot area. Accordingly, the present invention can provide a hermetic encapsulation package at low cost, which is outstandingly resistant to thermal shock. In addition, in Examples 3 to 6, although the Young's modulus of the samples provided with a gas barrier layer was not measured, it was noticed that an increase in volume was 5% or more at 85° C. and a decrease in volume was 5% or more at −35° C. Based on this fact, it can be found that a sealing cap provided with a gas barrier layer is deformed to provide a desired change in volume.

On the other hand, it is found that the package according to comparative examples 1 and 2, providing a change in volume of ±2%, cause dark spot areas to spread widely and is vulnerable to thermal shock.

What is claimed is:

1. A hermetic encapsulation package comprising:
   a support substrate;
   at least one element mounted on said support substrate; and
   a sealing cap bonded to said support substrate accommodating said element to form a sealed space defined by said support substrate and said sealing cap, said sealing cap being deformable to vary a volume of said sealed space according to an increase or a decrease in pressure inside said sealed space,
   wherein said sealed space provides a decrease in volume of 5% or more at −35° C. and an increase in volume of 5% or more at 85° C., relative to a volume at 25° C.

2. The hermetic encapsulation package according to claim 1, wherein said element is an organic electroluminescent element comprising a pair of electrodes and an organic compound layer, having at least a light-emitting layer composed of an organic compound, sandwiched by said electrodes.

3. The hermetic encapsulation package according to claim 1, wherein a portion of said sealing cap, opposite to said support substrate, is deformable according to an increase or a decrease in pressure inside said sealed space to vary the volume of said sealed space.

4. The hermetic encapsulation package according to claim 1, wherein said sealing cap increases and decreases the volume of said sealed space so as to relax a change in pressure caused by a change in temperature of a gas inside said sealed space in a manner such that said sealing cap is deflected outwardly relative to said sealed space increasing temperatures to increase the volume of said sealed space and is deflected inwardly relative to said sealed space with decreasing temperatures to decrease the volume of said sealed space.

5. The hermetic encapsulation package according to claim 1, wherein at least part of said sealing cap is formed of an elastic material of a Young's modulus of 70 GPa or less.

6. The hermetic encapsulation package according to claim 1, wherein a gas barrier layer is provided on both or one of outer and inner surfaces of said sealing cap.

7. The hermetic encapsulation package according to claim 1, wherein said support substrate and said sealing cap are bonded to each other with an ultraviolet curing resin.

8. The hermetic encapsulation package according to claim 7, wherein said ultraviolet curing resin is an epoxy-based resin.

9. The hermetic encapsulation package according to claim 1, wherein bellows are provided on at least part of said sealing cap.

10. A hermetic encapsulation package comprising:
    a support substrate;
    at least one element mounted on said support substrate; and
    a sealing cap bonded to said support substrate accommodating said element to form a sealed space defined by said support substrate and said sealing cap, said sealing cap being deformable to vary a volume of said sealed space according to an increase or a decrease in pressure inside said sealed space,
    wherein at least part of said sealing cap is formed of an elastic material of a Young's modulus of 70 GPa or less.

11. The hermetic encapsulation package according to claim 10, wherein said element is an organic electroluminescent element comprising a pair of electrodes and an organic compound layer, having at least a light-emitting layer composed of an organic compound, sandwiched by said electrodes.

12. The hermetic encapsulation package according to claim 10, wherein a portion of said sealing cap, opposite to said support substrate, is deformable according to an increase or a decrease in pressure inside said sealed space to vary the volume of said sealed space.

13. The hermetic encapsulation package according to claim 10, wherein said sealing cap increases and decreases the volume of said sealed space so as to relax a change in pressure caused by a change in temperature of a gas inside said sealed space in a manner such that said sealing cap is deflected outwardly relative to said sealed space with increasing temperatures to increase the volume of said sealed space and is deflected inwardly relative to said sealed space with decreasing temperatures to decrease the volume of said sealed space.

14. The hermetic encapsulation package according to claim 10, wherein a gas barrier layer is provided on both or one of outer and inner surfaces of said sealing cap.

15. The hermetic encapsulation package according to claim 10, wherein said support substrate and said sealing cap are bonded to each other with an ultraviolet curing resin.

16. The hermetic encapsulation package according to claim 15, wherein said ultraviolet curing resin is an epoxy-based resin.

17. The hermetic encapsulation package according to claim 10, wherein bellows are provided on at least part of said sealing cap.

18. A method for fabricating a hermetic encapsulation package comprising the steps of:
    fabricating an organic panel by depositing on a support substrate by sputtering or by vapor deposition a predetermined pattern of an anode layer, an organic compound layer including at least a light-emitting layer composed of an organic compound, and a cathode layer in that order, or a predetermined pattern of a cathode layer, an organic compound layer including at least a light-emitting layer composed of an organic compound, and an anode layer in that order; and providing a deformable sealing cap, at least part thereof being formed of an elastic material having a Young's modulus of 70 GPa or less, and bonding said sealing cap to said support substrate in a dried atmosphere so as to form a sealed space accommodating a pixel-formed portion of said organic panel.

19. The method for fabricating a hermetic encapsulation package according to claim 18, wherein said support substrate and said sealing cap are bonded to each other with an ultraviolet curing resin.

20. The method for fabricating a hermetic encapsulation package according to claim 18, wherein said step of bonding further comprises the step of forming a gas barrier layer on at least one of inner and outer surfaces of said sealing cap.

21. The method for fabricating a hermetic encapsulation package according to claim 20, wherein said step of forming said gas barrier layer allows said gas barrier layer to be formed by vapor deposition on said sealing cap before said sealing cap and said support substrate are bonded to each other.

22. The method for fabricating a hermetic encapsulation package according to claim 20, wherein said step of forming said gas barrier layer allows said gas barrier layer to be formed by vapor deposition on an outside of said sealing cap after said sealing cap and said support substrate are bonded to each other.

* * * * *